United States Patent [19]

Kitada et al.

[11] 4,411,757

[45] Oct. 25, 1983

[54] FORMATION OF ELECTRODES FOR MAGNETORESISTIVE SENSOR

[75] Inventors: Masahiro Kitada, Hamuramachi; Masahide Suenaga; Yukihisa Tsukada, both of Odawara; Noboru Shimizu, Tokorozawa; Hiroshi Yamamoto, Hamuramachi, all of Japan

[73] Assignee: Hitachi, Ltd., Tokyo, Japan

[21] Appl. No.: 386,302

[22] Filed: Jun. 8, 1982

[30] Foreign Application Priority Data

Jun. 10, 1981 [JP]   Japan ................................. 56-88148

[51] Int. Cl.$^3$ ............................................. C23C 15/00
[52] U.S. Cl. ................................. 204/192 E; 156/643
[58] Field of Search .................... 156/643; 204/192 E

[56] References Cited

U.S. PATENT DOCUMENTS

| | | | |
|---|---|---|---|
| 3,994,793 | 11/1976 | Harvilchuck et al. | 204/192 E |
| 4,308,089 | 12/1981 | Iida et al. | 204/192 E |
| 4,352,716 | 10/1982 | Schaible et al. | 204/192 E |
| 4,377,169 | 3/1983 | Banks | 204/192 E |

OTHER PUBLICATIONS

Bensauula et al. Appl. Phys. Lett. 426), Jan. 1983, p. 122-123.

*Primary Examiner*—Arthur P. Demers
*Attorney, Agent, or Firm*—Antonelli, Terry & Wands

[57] ABSTRACT

Electrodes for a magnetoresistive sensor can be formed easily by a method wherein a double-layer structure of Mo and Al on a film of a magnetoresistive material such as permalloy is formed to have a predetermined pattern, firstly by exposing an Al layer to a chemical etching solution or subjecting the Al layer to the ion-milling treatment to give said Al layer said pattern and then subjecting a Mo layer to the plasma etching or reactive sputter etching treatment to give said Mo layer said pattern.

9 Claims, No Drawings

FORMATION OF ELECTRODES FOR MAGNETORESISTIVE SENSOR

BACKGROUND OF THE INVENTION

This invention relates to a method of producing a thin film magnetoresistive sensor. Hitherto, aluminum or an aluminum alloy has been used as a material for electrodes or wiring metals having a minimum line width of 0.5 to 2 μm to be deposited on-to a magnetoresistive film, such as a permalloy (a Ni-Fe alloy) film, of the thin film magnetoresistive sensor. However, when the permalloy film and aluminum are heated to a temperature of 200° to 300° C. or higher, diffusion of atoms takes place therebetween. Therefore, during the vapor deposition of aluminum electrodes or in a subsequent heating step, the magnetic properties of the permalloy film are considerably degraded. The permalloy film is usually very thin, that is, about 200 to 400 Å in thickness, and it is, therefore, very sensitive to the reaction with the electrode material. The reaction between the permalloy film and aluminum can be prevented by employing a multilayered electrode structure comprising a double layer structure of Mo and Al (or an Al alloy) which (hereinafter referred to as Mo/Al) is characterized by a barrier layer of Mo provided between the Al layer and the permalloy film to interrupt the reaction between Al and permalloy. This prevention of the reaction is due to the fact that Mo has a very high melting point and the diffusion of atoms will hardly occur at a low temperature. Furthermore, no reaction between permalloy and Mo occurs, at a temperature of not higher than 400° to 500° C. Accordingly, the thin film magnetoresistive sensor using a Mo/Al multilayered electrode can endure heat treatment at a temperature of 400° to 500° C., even after the formation of the electrodes. However, with the Mo/Al electrode, a reaction does occur between Mo and Al to form a very thin layer of an intermetallic compound such as Mo$_3$Al (hereinafter referred to as Mo/Al reacted layer) at the interface between Mo and Al. Although the intermetallic compound layer is too thin to damage the electrical properties of the Mo/Al electrode, it has such a high chemical resistance that extreme difficulty is involved in making the electrode with a chemical etching solution.

When an Al monolayer film is used as an electrode, the fine processing of the Al film with a minimum line width of 0.5 to 2 μm can be accomplished with an alkaline etching solution such as an NaOH or KOH solution, without attacking the permalloy film. Also, when Mo as a material for a monolayer electrode is provided on the permalloy film, a chemical etching solution similar to the one used for Al may be used. However, a multilayer wiring of Mo with a good electric conductor such as Al and Au is required, since the use of Mo alone leads to a higher wiring resistance. On the other hand, when the Mo/Al double-layer electrode is adopted, the formation of the above-mentioned intermetallic compound layer at the interface between Mo and Al results in that only the unreacted Al layer undergoes chemical corrosion, leaving the Mo/Al reacted layer and the Mo layer therebeneath intact. Therefore, an electrode having the Mo/Al double-layer structure is very difficult to make.

The above-mentioned intermetallic compound can be processed by using a chemical etching solution based on a strong acid such as aqua regia. However, such an acid etching solution will also attack the permalloy film and, accordingly, it cannot be used. Attempts have also been made to etch the intermetallic compound by using a variety of alkali solutions, with great difficulties.

The following references are cited to show the state of the art: (i) U.S. Pat. No. 4,052,748 and (ii) IBM Technical Disclosure Bulletin, vol. 17, No. 4 (September, 1974), pages 967 and 968.

SUMMARY OF THE INVENTION

An object of this invention is to provide a method for easily forming an electrode having a Mo/Al double layer, used for a magnetoresistive sensor comprising a film of permalloy or the like as mentioned above.

In order to achieve the above-mentioned object, according to the method of this invention, a mask having a predetermined pattern is provided on a double layer consisting of a Mo film, at least a part of which is formed on a magnetoresistive film, and an Al or Al alloy film (hereinafter referred to simply as the Al film) deposited on the Mo film. Then the Al film alone or both the Al film and the Mo/Al reacted layer are processed to have the predetermined pattern corresponding to the mask by a technique suitable for etching Al, for instance, by etching with a chemical etching solution or by ion-milling technique and thereafter, the residual Mo film or the Mo film and the Mo/Al reacted film are processed to have the same pattern as that of the Al film by plasma etching or reactive sputter etching.

DESCRIPTION OF THE INVENTION

As a material for the magnetoresistive film, permalloy (a Ni-Fe alloy) is generally used, but any ferromagnetic material exhibiting magnetic anisotropy, consisting mainly of Ni, Fe, Co, Cr and/or Ti may also be used.

As a material for the above-mentioned mask, a photoresist is generally used, but a metal which is not selectively etched when Al is etched may also be used.

The Mo film is preferably deposited in a thickness of 100 to 300 Å. When the thickness is less than 100 Å, the Mo film is deposited in a discontinuous island-like form, so that the Al conductor and the permalloy film are permitted to contact and react with each other, that is, the Mo film cannot serve as a barrier film. On the other hand, when the thickness of the Mo film exceeds 3000 Å, the Mo film may be cracked or peeled off from the permalloy film because of an internal strain or the like of the Mo film. Therefore, the thickness of the Mo film should not be greater than 3000 Å.

The Al film on the Mo film may be deposited in such a thickness that said Al film as an electrode conductor can offer an electric conductivity required by the magnetoresistive sensor. Such thickness is already known in the art. As a material for the conductive layer deposited on the Mo film, there may be used an Al alloy, such as an Al-Cu alloy, Al-Mg alloy or Al-Ni alloy, as well as unalloyed Al, which has commonly been used for wiring of microelectronic devices.

In a magnetoresistive sensor using a Mo barrier film provided between an Al conductor and a magnetoresistive film such as a permalloy film, as described above, the reaction between the magnetoresistive film and Al is prevented and, therefore, the degradation of magnetic properties of the magnetoresistive film does not occur. For instance, in the case of a magnetoresistive sensor comprising permalloy as a magnetoresistive film and Mo as a barrier film, the amount of change in a reluctivity is not degraded even when the sensor is heated to 300° C. for 1000 hrs., whereas in the case of a magnetoresistive sensor using the permalloy film but no Mo barrier film, the amount of change in a reluctivity is degraded to be ½ to 1/10 lower than the original value when heated in the same manner as mentioned above. Accordingly, the Mo film exhibits an almost perfect barrier effect.

When the Al film is etched by using a chemical etching solution, only the unreacted Al in the Mo/Al double-layer electrode is firstly etched by a conventional chemical etching technique. Thereafter, the Mo/Al intermetallic compound layer and Mo are etched by a conventional reactive sputter etching or plasma etching technique using a gas containing a halogen compound such as $CF_4$.

When the ion-milling technique is used to etch the Al film, the unreacted Al and the Mo/Al reacted layer in the Mo/Al double-layer electrode are firstly processed by the ion-milling technique. Then, the residual portion of the Mo/Al reacted layer and Mo is processed by the reactive sputter etching or plasma etching technique using a gas containing a halogen compound such as $CF_4$.

The magnetoresistive sensor as mentioned above is already known to be normally composed of a substrate and magnetoresistive films, electrodes, magnetic shielding films and isolating films provided on said substrate.

DESCRIPTION OF THE PRESENTLY PREFERRED EMBODIMENTS

Example 1

A magnetoresistive permalloy (a Ni- 20 wt % Fe alloy in this example) film having a thickness of, e.g., 300 Å, was formed on a desired substrate such as a piece of glass. Then Mo was vacuum-deposited on the permalloy film, in a suitable thickness of, e.g., 1000 Å, and Al was vacuum-deposited thereon in a thickness of conductor required, e.g., 0.5 μm, to form electrodes. A photoresist pattern was then formed as a mask for obtaining a desired electrode shape. By using the thus formed mask, an upper part of the Al conductor layer was etched with a known chemical etching solution containing KOH, potassium ferricyanide and $NaH_2PO_3.12H_2O$ in water. The method of etching Al is not restricted to the one as described herein and may be other chemical etching methods known in the art. Only the portion of the Al layer unreacted with Mo was etched by the chemical etching. After the Al layer was chemically etched, the remaining Mo/Al reacted layer and the Mo layer were removed by a known plasma etching technique using an atmosphere consisting mainly of $CF_4$ (in this example, an atmosphere consisting of 92 vol % of $CF_4$ and 8 vol % of $O_2$ was used). In the plasma etching, a molybdenum halide was formed by radical F generated in the plasma, the halide being evaporated because of its high vapor pressure. In addition, part of Al in the Mo/Al layer was evaporated as a halide and the residual Al was etched by sputtering. Accordingly, the Mo/Al reacted layer and the Mo layer which had not been removed by the chemical etching could sufficiently be etched by the plasma etching to form a fine pattern with a minimum line width of 0.5 to 2 μm. On the other hand, Ni and Fe constituting the permalloy film were not bonded to halogen ions and, therefore, the permalloy film was not etched at all in the plasma. When a gaseous mixture prepared by adding $O_2$ to $CF_4$ is an amount of about 5 to 10% was used as an atmosphere for plasma etching, the etching speed became higher and an excellent electrode pattern was obtained.

Example 2

Mo/Al electrodes were formed in the same manner as in Example 1, except that a Ni- 23 wt % Co alloy used as a material for the magnetoresistive film. The Mo/Al electrodes could be formed to have a fine pattern with a minimum line width of 0.5 to 2 μm as in Example 1.

Example 3

Mo/Al electrodes were formed in the same manner as in Example 1, except that a Co- 10 wt % Fe alloy was used as a material for the magnetoresistive film. The Mo/Al electrodes could be formed to have a fine pattern with a minimum line width of 0.5-2 μm as in Example 1.

Example 4

A magnetoresistive permalloy film (in this example, made of a Ni- 20 wt % Fe alloy) of a suitable thickness of, e.g., 300 Å, was formed on a substrate such as a piece of glass. Then Mo was vacuum-deposited on the permalloy film in a thickness of, e.g., 1000 Å, and Al was vacuum-deposited thereon in a thickness of conductor required, e.g., 0.5 μm, to form double-layer electrodes. A photoresist pattern was then formed as a mask for obtaining a desired electrode shape. In the presence of the thus formed mask, the Al layer and the Mo/ Al reacted layer in the double-layer electrodes were etched by a known ion-milling technique using an Ar gas, leaving the Mo layer. In this case, the Mo layer can also be etched if the ion-milling operation is further continued. However, because of the extremely minute thickness (several hundred Å) of the permalloy film beneath the Mo film, it is very difficult to stop the ion-milling operation at the interface between Mo and permalloy without giving any damage to the permalloy film. For this reason, the Mo layer was left unetched in the ion-milling operation, and then only the Mo layer was formed by plasma etching. When the plasma etching was conducted in a gas consisting mainly of $CF_4$ (in this example, a gaseous mixture of 82 vol % $CF_4$ and 8 vol % $O_2$ was used), Mo formed a fluoride having a high vapor pressure and was evaporated. On the other hand, Ni and Fe constituting the permalloy film did not form any fluorides having a high vapor pressure and, therefore, they were not evaporated. Accordingly, the plasma etching could be stopped at the interface between Mo and permalloy. Thus, the Mo/Al double-layer electrodes having a minimum line width of 0.5 to 2 μm by firstly processing the Al layer and the Mo/Al reacted layer of the Mo/Al double-layer electrodes by ion-milling and then subjecting the Mo layer to the plasma etching.

Example 5

Mo/Al electrodes were formed in the same manner as in Example 4, except that a Co- 10 wt % Ti alloy was used as a material for the magnetoresistive film. The Mo/Al electrodes could be formed to have a fine pattern with a minimum line width of 0.5 to 2 μm as in Example 4.

Example 6

Mo/Al electrodes were formed in the same manner as in Example 4, except that a Ni- 23 wt % Co alloy was used as a material for the magnetoresistive film. The Mo/Al electrodes could be formed to have a fine pattern with a minimum line width of 0.5 to 2 μm as in Example 4.

Although unalloyed Al was used as a material for conductor layer in the above-mentioned Examples, the same effects as obtained in the Examples were obtained when a conductor film of an alloy showing little electromigration, such as Al- 4% Cu, Al- 2% Mg and Al- 2% Ni was used in place of the Al conductor layer.

Obviously, many modifications and variations of this invention are possible in the light of the above teachings. It is, therefore, to be understood that within the scope of the appended claims the invention may be practiced otherwise than as specifically desired.

What is claimed is:

1. A method of forming electrodes for a magnetoresistive sensor comprising the steps of
   (a) providing a mask of a predetermined pattern on a double-layer structure comprising a Mo film of which at least a portion is formed on a magnetoresistive film and an Al or Al alloy film deposited on said Mo film;
   (b) exposing said Al or Al alloy film to an etching environment to etch at least said Al or Al alloy film into said predetermined pattern; and
   (c) processing, after the completion of said step
   (d) at least said Mo film to have a pattern corresponding to that of said Al or Al alloy film by a plasma etching or reactive sputter etching technique.

2. The method according to claim 1, wherein said Al or Al alloy film is etched by using a chemical etching solution in said step (b) and a Mo/Al reacted layer and said Mo film are etched in said step (c).

3. The method according to claim 1, wherein said Al or Al alloy film and said Mo/Al reacted layer are etched by an ion-milling technique in said step (b) and said Mo film is etched in said step (c).

4. The method according to claim 2, wherein the plasma etching is conducted in a gaseous atmosphere containing a halogen compound in said step (c).

5. The method according to claim 3, wherein the plasma etching is conducted in a gaseous atmosphere containing a halogen compound in said step (c).

6. The method according to claim 4, wherein said halogen compound is CF$_4$.

7. The method according to claim 5, wherein said halogen compound is CF$_4$.

8. The method according to any one of claims 1 to 7, wherein said magnetoresistive film consists of a ferromagnetic material containing Ni, Fe, Co, Cr and/or Ti as a main constitutent and exhibiting magnetic anisotropy.

9. The method according to claim 8, wherein said magnetoresistive film consists of a Ni-Fe alloy.

* * * * *